US006259718B1

(12) United States Patent
Okuda

(10) Patent No.: US 6,259,718 B1
(45) Date of Patent: Jul. 10, 2001

(54) DISTRIBUTED FEEDBACK LASER DEVICE HIGH IN COUPLING EFFICIENCY WITH OPTICAL FIBER

(75) Inventor: Tetsuro Okuda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/199,789

(22) Filed: Nov. 25, 1998

(30) Foreign Application Priority Data

Nov. 25, 1997 (JP) .................................................. 9-323263

(51) Int. Cl.[7] ........................................................ H01S 3/08

(52) U.S. Cl. ............................. 372/96; 372/96; 372/102; 372/34; 372/36; 372/92; 372/99; 372/46; 372/45; 372/49; 372/50

(58) Field of Search ................................ 372/96, 99, 92, 372/46, 45, 49, 102, 34, 36, 50

(56) References Cited

U.S. PATENT DOCUMENTS 4,658,402 * 4/1987 Kobayashi ............................. 372/50
4,783,788 * 11/1988 Gordon ................................. 372/45
4,813,054 * 3/1989 Plumb ................................... 372/96
4,894,834 * 1/1990 Kakimoto et al. ..................... 372/44
4,951,292 * 8/1990 Kuindersma et al. ................. 372/49
5,292,685 * 3/1994 Inoguchi et al. ....................... 438/32
5,321,716 * 6/1994 Kinoshita et al. ..................... 372/96
5,357,538 * 10/1994 Talneau et al. ........................ 372/96
5,533,041 * 7/1996 Matsuda et al. ....................... 372/50
5,642,371 * 6/1997 Tohyama et al. ...................... 372/45
5,689,358 * 11/1997 Nakao et al. ........................ 359/248
5,970,081 * 10/1999 Hirayama et al. ..................... 372/96
5,978,400 * 11/1999 Campbell et al. ..................... 372/46
6,008,675 * 12/1999 Handa .................................... 327/96

FOREIGN PATENT DOCUMENTS

98/43329 * 10/1998 (WO) .................................... 372/92

OTHER PUBLICATIONS

A. Uda et al., "Spot–size Expanded High Efficiency 1.3 ν MQW Laser Diodes with Laterally Tapered Active Stripe", International Conference on Indium Phosphide and Related Materials, Conference Proceedings, 1997, pp. 657–660.

* cited by examiner

*Primary Examiner*—Frank G. Font
*Assistant Examiner*—Delma R. Flores Ruiz
(74) *Attorney, Agent, or Firm*—Sughrue, Mion, Zinn, Macpeak & Seas, PLLC

(57) ABSTRACT

A distributed feedback laser device comprises an optical waveguide having one end facet serving as a beam emission surface and the other end facet serving as a reflection surface, an active layer formed between the beam emission surface and the reflection surface, and a diffraction grating formed so as to extend along the active layer in the optical waveguide. The active layer has a first region located nearer to the beam emission surface than to the reflection surface and a second region located nearer to the reflection surface than to the beam emission surface. The first region is narrower in width than the second region. The diffraction grating has first and second portions located along the first and the second regions, respectively. The first portion is longer in pitch than the second portion.

8 Claims, 8 Drawing Sheets

1.2 μm
104
101
PITCH 203.5 nm
105
102
0.6 μm
103
PITCH 204.3 nm

DISTRIBUTED FEEDBACK LASER DEVICE HIGH IN COUPLING EFFICIENCY WITH OPTICAL FIBER

BACKGROUND OF THE INVENTION

The present invention relates to a distributed feedback laser device (will be abbreviated to a DFB laser device) which is suitable for using as a light source in middle and long distances-optical transmission systems.

As well known in the art, the distributed feedback laser device is suitable for using as the light source in the middle and the long distances-optical transmission systems because such a laser device has high output characteristic, high output efficiency characteristic, and excellent single-modality of oscillation wavelength and is capable of performing satisfactory function in coupling with the optical fiber.

Recently, it is requested to provide a laser module which is small in size and low in price. In order to be applied into the laser module, it is requested to provide the DFB laser device which does not need any temperature control and a control unit for the control and which is excellent in temperature characteristic. It is especially important that the DFB laser device has the high output and the high efficiency characteristics under a high temperature (e.g. 85° C.).

To satisfy such a request, a semiconductor laser device having improved temperature characteristic has developed by applying a multiple quantum well or a strained multiple quantum well structure to an active layer.

On the other hand, a spot-size conversion laser device has been recently developed. The spot-size conversion laser device provides high output characteristic because the device is reduced in an emission angle and is enhanced in a coupling efficiency with optical fiber.

A beam emission shape, which is important to couple the semiconductor laser device with the optical fiber, becomes a shape that an electrical field distribution shape on an emission surface (a near field pattern) is transformed by Fourier transform. Generally, as the near field pattern is enlarged in width, the emission angle is reduced.

The spot-size conversion laser device is, for example, disclosed in "1997 International Conference on Indium Phosphide and Related Material, Conference Proceedings, page 657". In the proceedings, the spot-size conversion laser device is a lateral active tapered type spot-size conversion laser device with the whole of a cavity resonator (will be abbreviated to a cavity) formed by an active region or an active domain. Such a laser device is regarded as a promising device because the device has an excellent temperature characteristic and a high yield.

The semiconductor laser device disclosed in the proceeding is characterized by a good point that the width of an optical waveguide which serves as an active layer is narrower at the portion nearer a beam emission surface. The semiconductor laser device of the type is capable of shortening a device length relatively because the optical waveguide is substantially formed by the active region, which results in a advantage in a yield. In addition, the laser device has another good point that it can be manufactured by the same manufacturing process as that of a conventional semiconductor laser device.

As for the DFB laser device excellent in single-modality of oscillation wavelength, it is also necessary to consider the means to enhance the coupling characteristic with the optical fiber by reducing the beam emission angle when the device is coupled with the optical fiber.

For example, the lateral active tapered type spot-size conversion laser device mentioned above has a structure that the active layer, which combines with the optical waveguide, is reduced in width in a direction parallel to the beam emission surface. Namely, the active layer is changed in width along a cavity direction. With this structure, the active layer (the optical waveguide) is changed in an equivalent refractive index in the cavity direction.

Therefore, it is difficult to control an oscillation wavelength and the coupling efficiency, if the above-mentioned active layer structure is only applied to the DFB laser device.

SUMMARY OF THE INVENTION

It is therefore an object of the present invention to provide a distributed feedback laser device high in output characteristic, excellent in single-modality, and high in coupling efficiency with optical fiber.

The other objects, features, and advantages of the present invention will become clear as the following description proceeds.

A distributed feedback laser device to which this invention is applicable comprises an optical waveguide having one end facet serving as a beam emission surface and the other end facet serving as a reflection surface, an active layer formed between the beam emission surface and the reflection surface, and a diffraction grating formed in the optical waveguide so as to extend along the active layer.

According to an aspect of the present invention, the active layer has a first region located nearer to the beam emission surface than to the reflection surface and a second region located nearer to the reflection surface than to the beam emission surface. The first region is narrower in width than the second region. The diffraction grating has first and second portions located along the first and the second regions, respectively. The first portion is longer in pitch than the second portion.

DESCRIPTION OF THE PREFERRED EMBODIMENTS

In order to facilitate an understanding of the present invention, description will at first be made with reference to the drawings about a lateral active tapered type spot-size conversion laser device, which is an example of a conventional semiconductor laser device, disclosed in the proceeding referred to before.

Figure 1A:
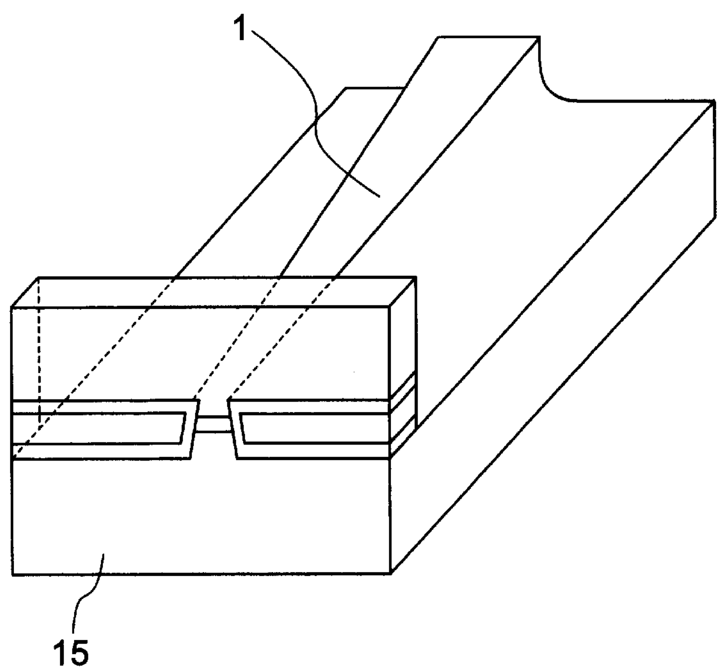
FIGS. 1A and 1B are perspective and partial plane views showing a lateral active tapered type spot-size conversion laser device which is an example of a conventional semiconductor laser device.
Figure 1B:
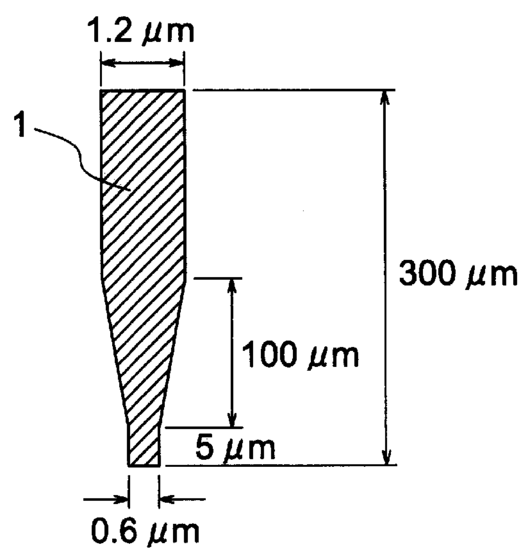

Referring to FIGS. 1A and 1B, the conventional semiconductor laser device comprises an active layer 1 formed on a substrate 15 and is characterized by a good point that an optical waveguide or an active layer near to a beam emission surface changes so that the width is reduced. The size of the active layer 1 is shown in FIG. 1B.

The semiconductor laser device is capable of shortening a device length relationally and is advantageous about a yield because the whole optical waveguide is formed by the active region. In addition, the laser device has another good point that is can be manufactured by the same manufacturing processes as that of a conventional semiconductor laser device.

In such as a structure, the active layer (the optical waveguide) is changed in an equivalent refractive index in the cavity direction. Therefore, it is difficult to control an oscillation wavelength and the coupling efficiency, if the above-mentioned active layer is only applied to the DFB laser device.

Figure 2:
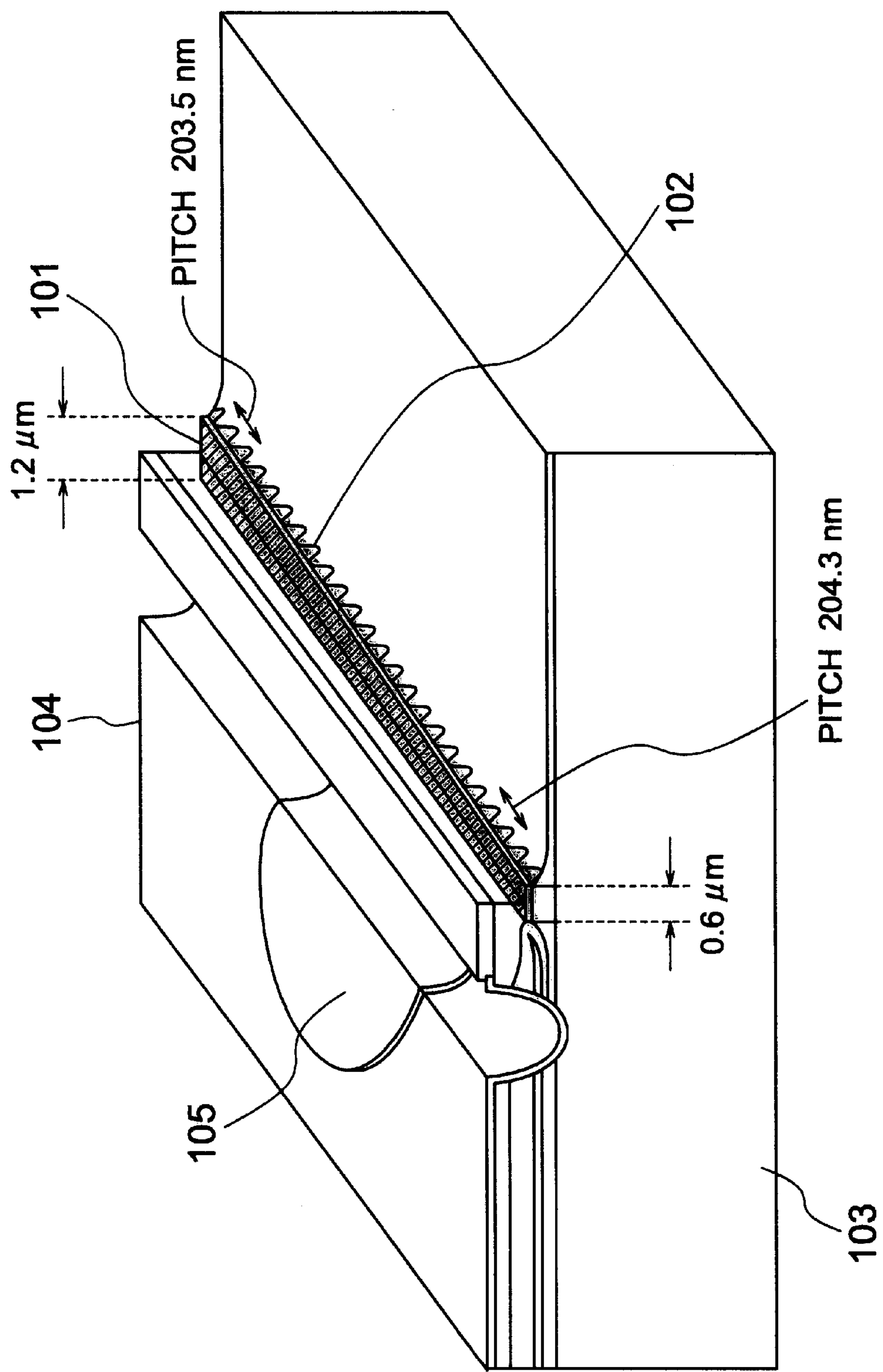
FIG. 2 is a perspective view showing a DFB laser device according to the present invention.

FIG. 2 shows a distributed feedback laser device according to the present invention. As to structure above an active layer 101, a right half portion taken along a supposed center line extending in an optical waveguide direction is omitted in FIG. 2.

Referring to FIG. 2, the DFB laser device according to the present invention comprises the active layer 101 that a part thereof serves as the optical waveguide and an electrode 105. Low and high reflectance films 103 and 104 are formed on one and the other facets opposite to each other on the DFB laser device (the optical waveguide), respectively. One and the other facets serve as a beam emission and reflection surfaces, respectively. Namely, the active layer 101 is formed between the low and the high reflectance films 103 and 104. The DFB laser device further comprises a diffraction grating 102 formed so as to extend along the active layer 101 in the optical waveguide.

Figure 3A:
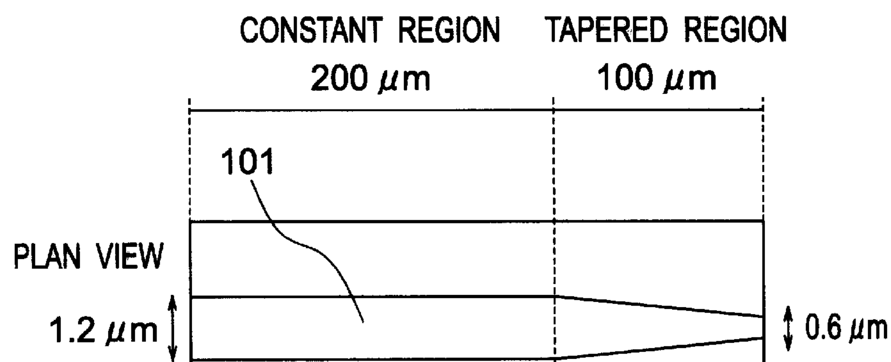
FIGS. 3A and 3B are schematic plan and schematic cross-sectional views illustrating the DFB laser device according to the present invention.
Figure 3B:
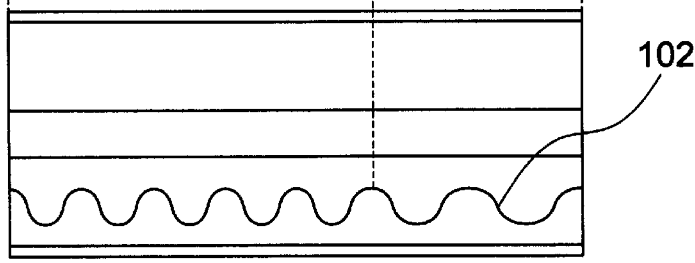

Referring to FIGS. 2, 3A, and 3B, the active layer 101 has a first region, serving as a tapered region, located nearer to the low reflectance film 103 than to the high reflectance film 104 and a second region, serving as a constant width region, located nearer to the high reflectance film 104 side than to the low reflectance film 103. The tapered region is narrower in width than the constant width region. The diffraction grating 102 has first and second portions located along the taper and the constant width regions, respectively. The first portion is longer in pitch than the second portion.

The tapered region of the active layer 101 is gradually reduced in width towards the low reflectance film 103. The tapered region has one end close to or contact with the low reflectance film 103.

In this embodiment, the active layer 101 comprises the tapered region and the constant width region. The tapered region has one end close to or in contact with the low reflectance film 103. The tapered region is continuously reduced in width towards the low reflectance film 103. On the other hand, the constant width region is constant in width. The diffraction grating 102 has the first and the second portions located along the taper and the constant width regions, respectively. The first portion of the diffraction grating 102 has the pitch longer than the pitch of the second portion.

Figure 4:
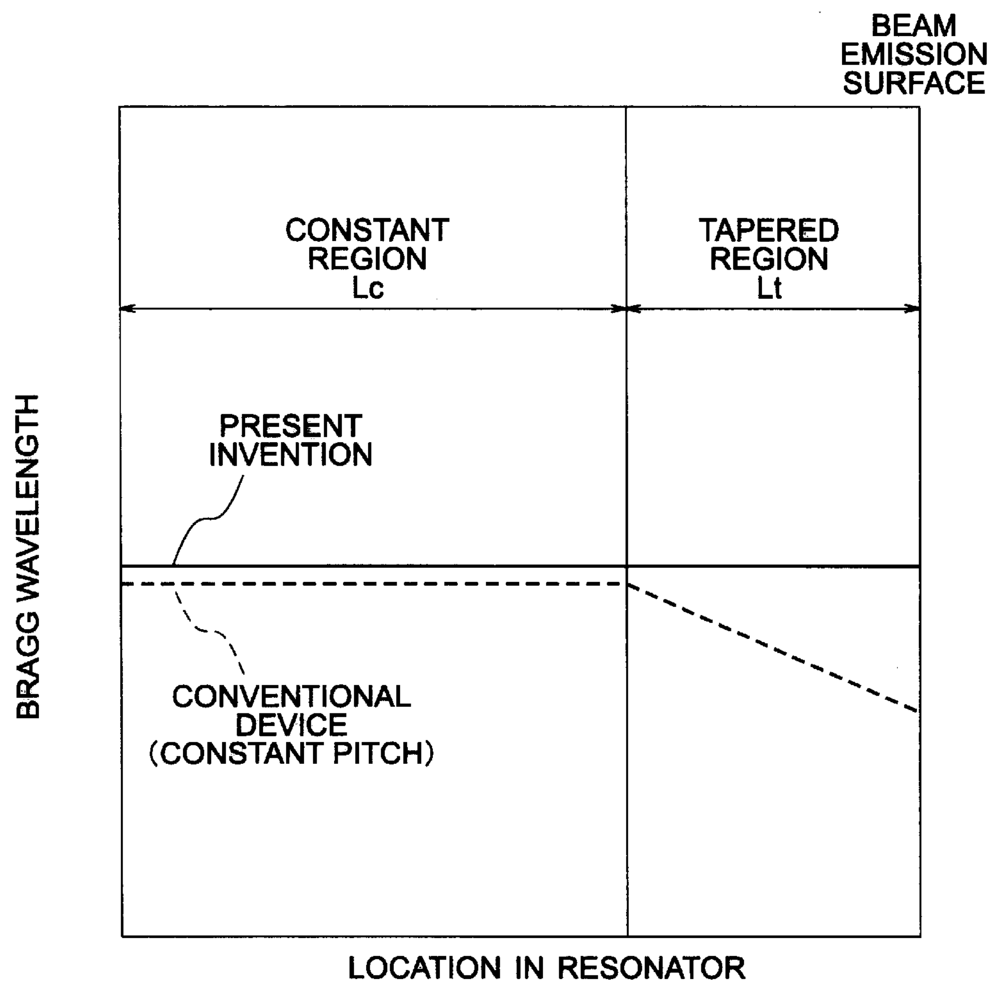
FIG. 4 is a line graph illustrating the DFB laser device according to the present invention.

FIG. 4 shows change of the Bragg wavelength at each point in the cavity direction throughout the cavity of the DFB laser device structured as mentioned above. The Bragg wavelength is two times as long as product of an equivalent refractive index of the optical waveguide and the pitch of the diffraction grating 102.

On another hand, the conventional or the general DFB laser device, which has the active layer constant in width and the diffraction grating constant in pitch thereof, oscillates at the Bragg wavelength.

On the other hand, another conventional DFB laser device comprises the optical waveguide tapered in width. When the other conventional DFB laser device is provided with the diffraction grating constant in pitch thereof throughout the cavity direction, the optical waveguide is changed in the equivalent refractive index thereof in the tapered region. In consequence, the Bragg wavelength is also changed in the tapered region as shown by a dashed line in FIG. 4. Such a change of the Bragg wavelength causes a phenomenon that the DFB laser device is unstable in single-modality of oscillation and/or deviates from a designed value of the coupling efficiency.

In order to control the Bragg wavelength so that it is not changed and to provide a waveguide structure constant in the Bragg wavelength in the direction throughout the cavity direction, the DFB laser device according to the present invention uses a structure which comprises the diffraction grating 102 changed in pitch thereof so that the pitch is related to the width of the active layer 101. As a result, the Bragg wavelength is constant in the tapered region as shown by a solid line in FIG. 4 throughout the cavity direction. In consequence, the DFB laser device is stable in single-modality of oscillation and is just the right designed value in the coupling efficiency.

In FIG. 4, although the length ratio of the tapered region to the constant width region (Lt/Lc) may be optionally selected so that the DFB laser device is capable of effects of the tapered region, it is preferred that the length ratio (Lt/Lc) falls within a range from 1/5 and more in order to obtain the better effects.

In order to obtain the better effects, it is also preferred that the tapered region is reduced in width to at least a half per 50 $\mu$m in length of the tapered region because the optical waveguide is effectively suppressed or repressed in loss caused in scattering of light which travels the optical waveguide.

Furthermore, it is preferred that the diffraction grating 102 extending along the tapered region increases in pitch thereof towards the low reflectance surface 3 so that an equal value is obtained at each point throughout the optical waveguide when a product of an equivalent refractive index of the optical waveguide and the pitch of the diffraction grating 102 is calculated.

Figure 5:
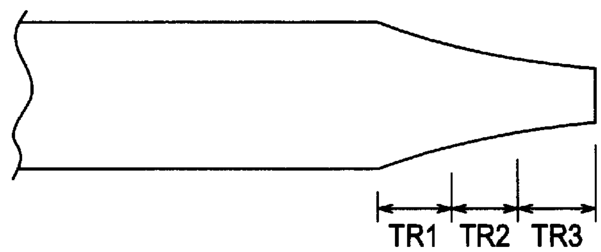
FIG. 5 is a schematic plane view showing a part of another distributed feedback laser device according to the present invention.

Although the whole of tapered region is reduced in width at a constant rate in this embodiment, the tapered region in the present invention may have a plurality of component regions (e.g. TR1, TR2, and TR3) reduced in width at different rates from each other as shown in FIG. 5. In such a structure, it is preferred that the component region nearer to the low reflectance film 103 is reduced more gently or gently in width than another. In FIG. 5, the component regions TR1, TR2, and TR3 are compared to each other in a reduction rate about width as the following inequality: TR1>TR2>TR3.

The DFB laser device according to the present invention is substantially manufactured by the conventional method for manufacturing the semiconductor laser device. The manufactured DFB laser device has specifications as follows.

The total length of the DFB laser device, that is, the resonance length is 300 μm. The lengths of the tapered and the constant width regions are 100 μm and 200 μm, respectively. The tapered region of the active layer 101 is 0.6 μm in width at the low reflectance film 103. The constant width region of the active layer 101 including the end close to or contact with the high reflectance film 104 is 1.2 μm in width. The end of the tapered region close to the constant width region is also 1.2 μm in width.

Figure 6:
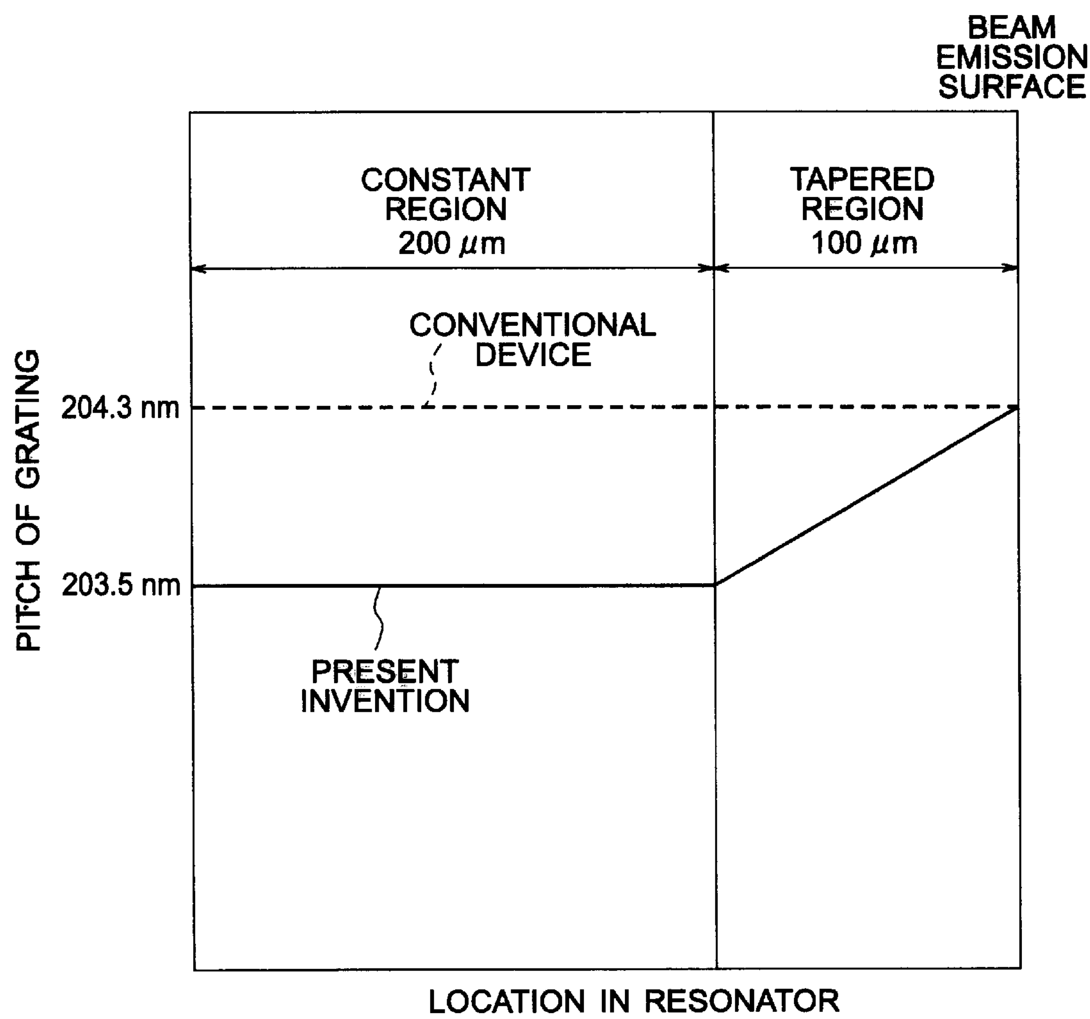
FIG. 6 is a line graph illustrating the distributed feedback laser device according to the present invention.

In FIG. 6, the pitch of the diffraction grating 102 is shown by a solid line. The first portion of the diffraction grating 102 is 204.3 nm in pitch at one end close to or contact with the low reflectance film 103, while the first portion is 203.5 nm in pitch at the other end close to or contact with the second portion. The second portion is also 203.5 nm and is constant in pitch throughout thereof. As the result, the DFB laser device is constant in the Bragg wavelength throughout the cavity direction. On the other hand, a dashed line shows the pitch of the diffraction grating of the conventional DFB laser device mentioned before. The conventional diffraction grating is constant and is 204.3 nm in pitch throughout the cavity direction. Therefore, the conventional DFB laser device is not constant in the Bragg wavelength.

Now, a method for manufacturing the DFB laser device according to the present invention will be described in detail with reference to the drawings.

Figure 7:
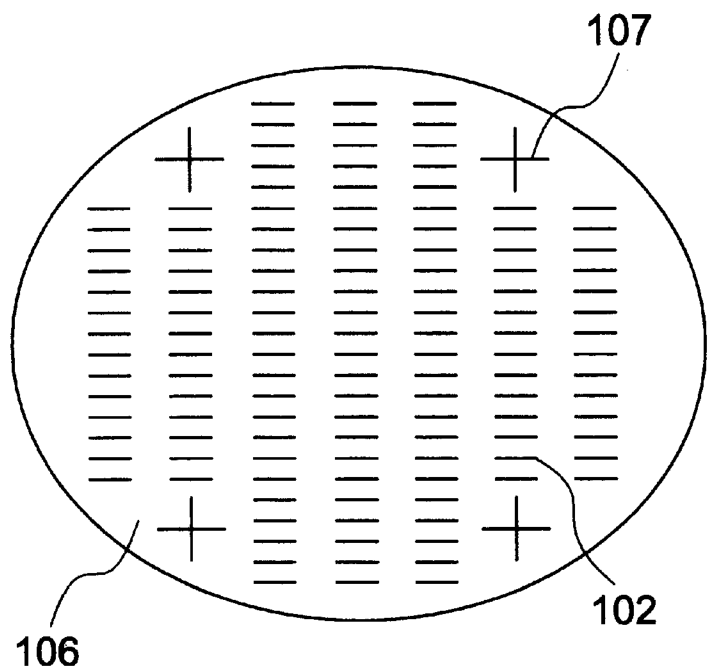
FIG. 7 is a schematic plane view of a substrate illustrating a method of manufacturing the distributed feedback laser device according to the present invention.

Referring to FIG. 7, after alignment marks 107s used for an electrical beam exposure were formed on the n-type InP substrate 106, the diffraction grating 102 having a modulated pitch is formed by the electrical beam exposure.

Figure 8:
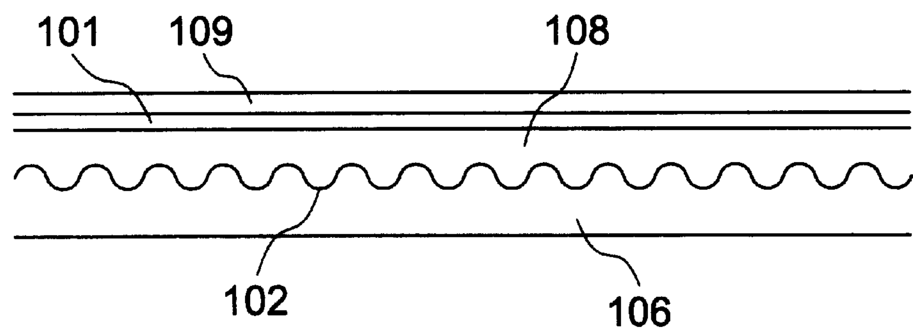
FIG. 8 is a schematic cross-sectional view of the distributed feedback laser device illustrating the method of manufacturing the device according to the present invention.

Referring to FIG. 8, an n-type InGaAsP optical guiding layer 108, the active layer 101, and a p-type InP cladding layer 109 are continuously formed on the diffraction grating 102. The active layer 101 comprises the multiple quantum well layer. The multiple quantum well layer has a structure that an InGaAsP well layer is sandwiched by a pair of barrier layers and that the sandwiched InGaAsP well layer is piled up seven times. The InGaAsP well layer is 1.27 μm in a band gap wavelength composition and is 5 nm in thickness. The barrier layer is 1.10 μm in the band gap wavelength composition and is 10 μm in thickness.

Figure 9A:
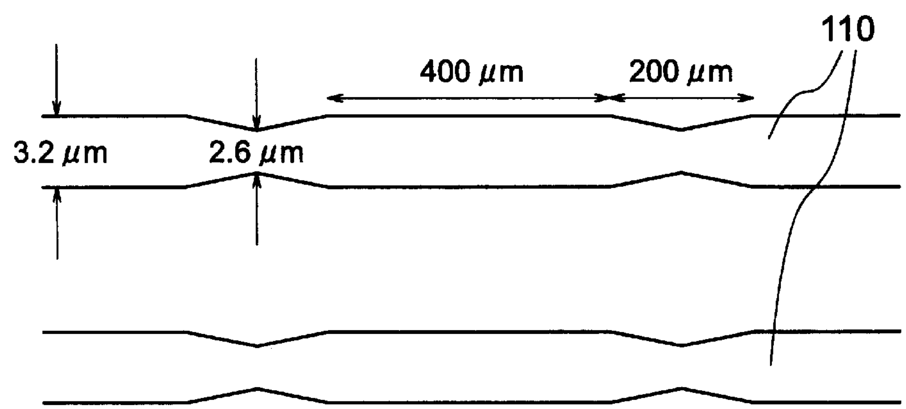
FIGS. 9A and 9B are schematic plan and schematic cross-sectional views of the distributed feedback laser device illustrating the method of manufacturing the device according to the present invention.
Figure 9B:
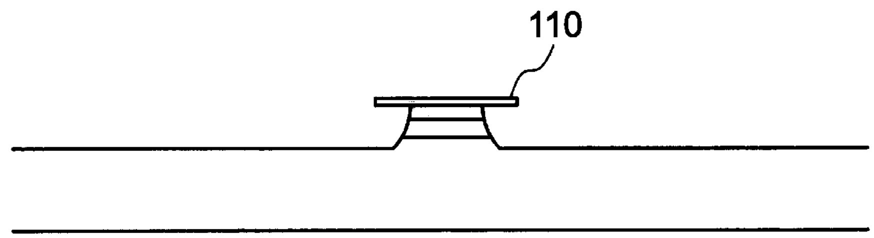

Referring to FIG. 9A, a plurality of masks 110s changed between 3.2 μm and 2.6 μm in width consisting of $SiO_2$ film are formed on the semi-processed device so as to correspond with the optical waveguide to be formed. Thus, a stripe mesa is formed as shown in FIG. 9B. In this event, the active layer is partially tapered in width so as to change from 1.2 μm to 0.6 μm caused by side etching.

Figure 10A:
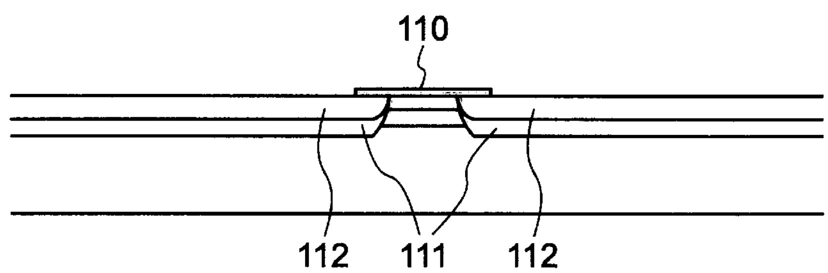
FIGS. 10A and 10B are schematic cross-sectional views of the distributed feedback laser device illustrating the method of manufacturing the device according to the present invention.
Figure 10B:
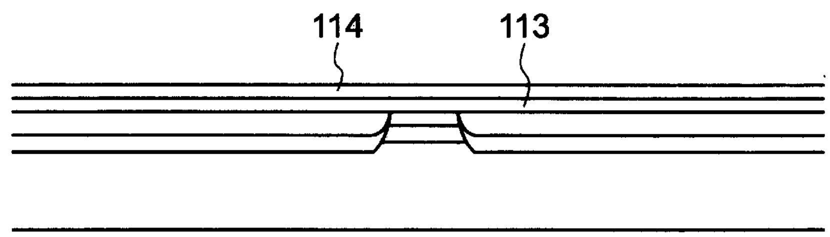

Referring to FIG. 10A, p-InP and n-InP current block layers 111 and 112 are grown on the both sides of the stripe mesa by an MOVPE process. Then, the mask 110 is removed. Referring to FIG. 10B, an n-InP embedded layer 113 and a p-InGaAsP contact layer 114 are grown over the stripe mesa and the n-InP current block layers 112s by the MOVPE process.

After an electrode is formed on the semi-processed device by electrode forming process known in the art, the semi-processed device is brought down into 300 μm in length by a cleavage process.

Hereafter, a low reflectance film 0.1% in a reflectance is formed on one end facet of the semi-processed device brought down, while a high reflectance film 90.0% in a reflectance is formed on the other end facet of the semi-processed device. Thus, the manufacturing of the DFB laser device is finished. The completed DFB laser device has the one and the other end facets serve as the beam emission and the reflection surfaces, respectively.

The completed DFB laser device oscillates at the wavelength of 1.31 μm and is 45 dB in a sub mode suppression ratio serving as an index of the stability of the single-mode oscillation. The DFB laser device is 0.50 W/A at a room temperature and is 0.35 W/A at 85° C. in an output efficiency when the device is evaluated about a current versus beam output characteristic. In the DFB laser device, no kink occurs until the beam output at 40 mW.

On the other hand, the conventional DFB laser device constant in pitch of the diffraction grating throughout the cavity direction and manufactured just like the embodiment is 40 dB in the sub mode suppression ratio. In the conventional DFB laser device, the kink occurs when the beam output exceeds 30 mW.

While the present invention has thus far been described in conjunction with a embodiment thereof, it will readily be possible for those skilled in the art to put the present invention into practice in various other manners.

What is claimed is:

1. A distributed feedback laser device comprising an optical waveguide having one end facet serving as a beam emission surface and the other end facet serving as a reflection surface, an active layer formed between said beam emission and said reflection surfaces, and a diffraction grating formed in said optical waveguide so as to extend along a lengthwise direction of said active layer, wherein:

said active layer has a first region extending in the lengthwise direction of said active layer and located nearer to said beam emission surface than to said reflection surface and a second region extending in the lengthwise direction of said active layer, adjoining said first region, and located nearer to said reflection surface than to said beam emission surface, said first region being narrower in width than said second region;

said diffraction grating having first and second portions located along said first and said second regions, respectively, said first portion being longer in pitch than said second portion.

2. A distributed feedback laser device as claimed in claim 1, wherein said first region is continuously reduced in width towards said beam emission surface.

3. A distributed feedback laser device as claimed in claim 2, wherein said first region is reduced in width to at least a half per 50 μm in length of said first region.

4. A distributed feedback laser device as claimed in claim 1, wherein said first region has one end close to said beam emission surface.

5. A distributed feedback laser device as claimed in claim 4, wherein said active layer exclusively comprises said first and said second regions;

said first region having one end close to said beam emission surface, said first region is continuously reduced in width towards said beam emission surface;

said second region being constant in width.

6. A distributed feedback laser device comprising an optical waveguide having one end facet serving as a beam emission surface and the other end facet serving as a reflection surface, an active layer formed between said beam emission and said reflection surfaces, and a diffraction grating formed in said optical waveguide so as to extend along said active layer, wherein:

said active layer comprises a first region located nearer to said beam emission surface than to said reflection surface and a second region located nearer to said reflection surface than to said beam emission surface, said first region being narrower in width than said second region;

said diffraction grating has first and second portions located along said first and said second regions, respectively, said first portion being longer in pitch than said second portion;

said first region has one end close to said beam emission surface and is continuously reduced in width towards said beam emission surface;

said second region is constant in width; and the length ratio of said first region to said second region falls within a range from about 1/5 to 1.

7. A distributed feedback laser device as claimed in claim 5, wherein said first region has a plurality of component regions which are reduced in width at different rates from each other, the component region nearer to said beam emission surface being reduced more gently in width than another.

8. A distributed feedback laser device comprising an optical waveguide having one end facet serving as a beam emission surface and the other end facet serving as a reflection surface, an active layer formed between said beam emission and said reflection surfaces, and a diffraction grating formed in said optical waveguide so as to extend along said active layer, wherein:

said active layer has a first region located nearer to said beam emission surface than to said reflection surface and a second region located nearer to said reflection surface than to said beam emission surface, said first region being narrower in width than said second region;

said diffraction grating having first and second portions located along said first and said second regions, respectively, said first portion being longer in pitch than said second portion; and a substantially equal value is obtained at each point throughout said optical waveguide when a product of an equivalent refractive index of said optical waveguide and a pitch of said diffraction grating is calculated.

* * * * *